(12) United States Patent
Molas et al.

(10) Patent No.: US 12,033,698 B2
(45) Date of Patent: Jul. 9, 2024

(54) METHOD FOR RESETTING AN ARRAY OF RESISTIVE MEMORY CELLS

(71) Applicants: COMMISSARIAT À L'ENERGIE ATOMIQUE ET AUX ÉNERGIES ALTERNATIVES, Paris (FR); WEEBIT NANO LTD, Hod-Hasharon (IL)

(72) Inventors: Gabriel Molas, Grenoble (FR); Alessandro Bricalli, Grenoble (FR); Guiseppe Piccolboni, Verona (IT); Amir Regev, Modiin (IL)

(73) Assignees: COMMISSARIAT A L'ENERGIE ATOMIQUE ET AUX ENERGIES ALTERNATIVES, Paris (FR); WEEBIT NANO LTD, Hod-Hasharon (IL)

( * ) Notice: Subject to any disclaimer, the term of this patent is extended or adjusted under 35 U.S.C. 154(b) by 131 days.

(21) Appl. No.: 17/782,446

(22) PCT Filed: Dec. 3, 2020

(86) PCT No.: PCT/EP2020/084409
§ 371 (c)(1),
(2) Date: Jun. 3, 2022

(87) PCT Pub. No.: WO2021/110807
PCT Pub. Date: Jun. 10, 2021

(65) Prior Publication Data
US 2023/0170023 A1    Jun. 1, 2023

(30) Foreign Application Priority Data
Dec. 4, 2019   (EP) ..................................... 19306571

(51) Int. Cl.
*G11C 13/00*    (2006.01)
(52) U.S. Cl.
CPC ........ *G11C 13/0097* (2013.01); *G11C 13/004* (2013.01)
(58) Field of Classification Search
CPC ............ G11C 13/0069; G11C 13/0007; G11C 13/003; G11C 13/004; G11C 2213/79;
(Continued)

(56) References Cited

U.S. PATENT DOCUMENTS 10,373,679 B1 *  8/2019  Lee ..................... G11C 13/0035
2016/0336066 A1   11/2016  Lin et al.

OTHER PUBLICATIONS

International Search Report as issued in International Patent Application No. PCT/EP2020/084409, dated Feb. 10, 2021.
(Continued)

*Primary Examiner* — Thong Q Le
(74) *Attorney, Agent, or Firm* — Pillsbury Winthrop Shaw Pittman LLP

(57) ABSTRACT

A method for resetting an array of Resistive Memory cells by applying a sequence of N reset operations, each reset operation including the application of a reset technique, the method including, at the first reset operation, performing the first reset operation by applying the reset technique having the highest relative correction yield; at the j-th reset operation of the N−1 subsequent reset operations, j being an integer number between 2 and N, defining a reset technique to be used at the j-th reset operation and performing the j-th reset operation.

8 Claims, 4 Drawing Sheets

(58) Field of Classification Search
CPC .............. G11C 13/025; G11C 2213/19; G11C 2213/71; G11C 2213/72; G11C 11/221; G11C 11/2255; G11C 11/2257; G11C 11/2259; G11C 11/2273; G11C 11/2295; G11C 11/2297; G11C 11/40618; G11C 11/408; G11C 11/56; G11C 13/0097; G11C 2013/009; G11C 2029/0409; G11C 2213/35; G11C 2213/75; G11C 29/021; G11C 29/028; G11C 29/52; G11C 2013/0083; G11C 7/1048; G11C 13/0026; G11C 13/0061; G11C 2013/0042; G11C 2013/0054; G11C 11/5678; G11C 13/0004; G11C 2013/0045; G11C 2013/0078; G11C 2013/0092; G11C 2213/15; G11C 2213/30; G11C 2213/78

See application file for complete search history.

(56) References Cited

OTHER PUBLICATIONS

Vianello, E., et al., "Resistive Memories for Ultra-Low-Power embedded computing design," IEEE International Electron Devices Meeting, (2014), 3 pages.

* cited by examiner

METHOD FOR RESETTING AN ARRAY OF RESISTIVE MEMORY CELLS

CROSS-REFERENCE TO RELATED APPLICATIONS

This application is the U.S. National Stage of PCT/EP2020/084409, filed Dec. 3, 2020, which in turn claims priority to European patent application number 19306571.1 filed Dec. 4, 2019. The content of these applications are incorporated herein by reference in their entirety.

TECHNICAL FIELD OF THE INVENTION

The invention belongs to the technical field of the Resistive Memory (RM) Cells. One object of the invention is a method for fast and efficient resetting or reprogramming an array of resistive Memory Cells in order to improve its memory window.

STATE OF THE ART

A Resistive Memory (RM) is a type of rewritable non-volatile memory cell. A RM cell comprises at least a first and a second electrode separated by an electrically insulating material. The application of a difference of electric potential to the two electrodes leads to the formation or the destruction of an electrical connection between the two electrodes. RM cells find application in the realization of Random Access Memories arrays called Resistive Random-Access Memories (ReRAM).

The formation of the electrical connection between the two electrodes corresponds to the low resistance state (LRS) of the RM cell. This state is also called ON state or conducting state. When the electrical connection is removed, the RM cell is in the high resistance state (HRS). This state is also called OFF state or insulating state. The electrical resistance associated to the LRS is called $R_{LRS}$, while the electric resistance associated to the HRS is called $R_{HRS}$.

The existence of these two ON/OFF states makes it possible to use the RM cell as a rewritable non-volatile memory by encoding one bit of information. A RM cell is also called a memory point.

Several mechanisms may be responsible for the formation of the electrical connection between the two electrodes (see for example the article "Resistive Memories for Ultra-Low-Power Embedded Computing Design" published by E. Vianello et al. in Electron Devices Meeting 2014 IEEE International). For example, in the case of memory cells known as OxRAM, an electric filament is formed by mobile ions present in the dielectric material separating the two electrodes. Alternatively, in resistive random-access memories known as CBRAM (Conductive Bridging RAM) one of the two electrodes supplies the ions which dissolving in the dielectric material form the filament. In ReRAM known as PCRAM (Phase Change RAM), the two electrodes are separated by a programmable region comprising a material able to change from crystalline to amorphous phase upon heating. In this case, the OFF state corresponds to the amorphous state of the programmable region, while the ON state corresponds to the crystalline state. PCRAM cells may also comprise a heater element inserted between the two electrodes and able to transform the applied voltage pulse in the heat necessary to modify the crystalline state of the programmable region.

During their utilisation, arrays of RM or ReRAM cells undergo a great number of SET and RESET operation. A SET operation comprises putting the cell in the LRS, a RESET operation comprises putting the cell in the HRS. The application of a SET followed by a RESET application or vice versa is called a cycle. Both SET and RESET operation can be performed by applying voltage pulses having opposite polarities.

Arrays of RM cells suffer from variability in the resistance value associated to HRS. FIG. 1 shows the distribution of the measured electric resistances for HRS and LRS in a ReRAM array after different number of cycles. This figure shows on the vertical axis the percentile of RM cells having a measured electrical resistance, represented on the horizontal axis. It is evident that, when in the HRS, memory points can have different resistance values and that the variability of the values $R_{HRS}$ is much higher than the variability of the values $L_{LRS}$. The large spreading of HRS leads to difficulties in distinguishing the two HRS and LRS states, and thus correction techniques are required to narrow the distribution of resistance values in the array. In other words, RM arrays in which the HRS and LRS states are not clearly distinguished may lead to errors in reading the array states and thus to RM arrays that are not reliable.

One of the most used techniques to reduce the variability in the HRS is the full reprogramming of the cell in which a setting of the cell is followed by a resetting. FIG. 2a sketches the full reprograming of a cell, with the state of the cell moving along the state distribution after performing a SET/RESET sequence. Due to the stochastic character of the filament formation, the resistive state will randomly move on any point of the corresponding distribution. If we introduce a Relative Correction Probability as the probability of finding a bit above a certain resistance threshold $R_{th}$ after reprogramming, this probability should be constant at each reprogramming iteration.

However, certain bits can deviate from this ideal behaviour and do not show a constant Relative Correction Probability. These bits need to be treated differently because the physical mechanism of their filament formation is inherently different. As a consequence, full reprogramming is not the most effective technique in this case.

Other correction techniques have been proposed, in order to stress more the cell during the set/reset operation, for instance by increasing the voltage pulse duration or amplitude.

In summary, among the proposed techniques there are:
Reprogram: if $R_{HRS}$ is too low after RESET, the cell is SET again before another RESET trial is performed. Reprogram sequence is thus SET+RESET.
Increased voltage: if $R_{HRS}$ is too low after RESET, another RESET iteration is applied, with a high applied voltage.
Increased time: if $R_{HRS}$ is too low after RESET, another RESET iteration is applied, with a longer applied pulse width.
Repeated pulse: if $R_{HRS}$ is too low after RESET, another RESET iteration is applied, keeping the same RESET pulse width and voltage amplitude.

Nevertheless, the person skilled in the art does not know any method to efficiently combine these techniques in order to obtain a reliable, fast and efficient resetting of an array of RM cells.

GENERAL SUMMARY OF THE INVENTION

To at least partially solve the technical problems mentioned above, the present invention discloses a method for resetting an array of Resistive Memory cells by applying a sequence of N reset operations, N being an integer number greater than 2, said method comprising the following steps:
- at the first reset operation, performing the first reset operation by applying the reset technique having the highest relative programming yield;
- at the j-th reset operation of the N−1 subsequent reset operations, j being an integer number comprised between 2 and N, defining a reset technique to be used at the j-th reset operation and performing the j-th reset operation.

By resetting an array of RM cells is meant the operation of putting at least one of the cells of the array into the HRS. The resetting operation can also be called resetting operation, correction operation or correction step.

By Resistive Memory cell is meant any type of resistive memory cells, comprising Resistive Random-Access Memory ReRAM cells. Examples of ReRAM cells are OxRAM, CBRAM, PCRAM.

By a sequence of reset operation is meant a series of reset or correction operations in which each reset operation comprises the application of a reset or correction technique. The method according to the invention comprises the application of N reset operation or reset steps.

By relative correction yield at the j-th reset operation is meant the fraction of cells that, being in the wrong resistive state at the (j−1)-th reset operation of the series, have been corrected by applying the given reset technique at the j-th reset operation of the series.

The relative correction yield for each of the reset techniques used and for each of the N reset operations performed is measured previously to the implementation of the method according to the invention.

The method according to the invention aims to establish an order for the application of the available reset or programming techniques, said order being based on proper figures of merit of the memory array, and in particular on the relative correction yield of the array. Thanks to the method disclosed by the invention, it is possible to choose an adapted sequence of reset techniques in order to obtain a fast and reliable resetting of an array of RM cells.

The method according to the invention defines, at each correction step, the best reset technique for the correction step, i.e. the reset technique that meets a predetermined condition.

The first reset technique is chosen as the reset technique having the highest relative correction yield.

According to an embodiment, at the subsequent N−1 correction steps, the correction technique having the highest relative correction yield at each step is chosen.

Advantageously, this allows to choose at each programming cycle j, the programming technique offering the highest efficiency for the j-th reprogramming cycle.

Thanks to the knowledge of relative correction yield at each reset step and for each of the reset techniques available, it is possible to dynamically adjust the reset technique used at each of the N reset steps.

Alternatively, the correction technique at each of the subsequent N−1 reset operation is chosen according to a predetermined condition. For instance, the predetermined condition can be that the reset technique to be used at the j-th correction is the reset technique having the highest relative correction yield among the values of the relative correction yield that have not yet been used prior to the j-th reset operation.

In other words, at each of the N−1 subsequent reset operations only the not yet used relative correction yields are considered in choosing the reset technique to be used.

The advantage of this embodiment is to consider not only the efficiency of the correction techniques at the j-th step, but also the efficiencies at the previous correction steps, in order to apply the most efficient techniques.

Advantageously, the method according to the invention allows to combine several reset techniques, the combination accounting also for the reset techniques not yet used at the j-th step. Varying the correction techniques allows to correct also the bits that do not show a standard behaviour at that needs to be stressed more in order to be reinitialized.

Advantageously, the method disclosed in the present invention allows to find and use the most efficient sequence of reset techniques for resetting an array of RM cells based on proper figure of merit of the array, and in particular on the relative correction yield. By evaluating, at each reset step, the efficiency of the available reset techniques, a fully adapted sequence can be built.

By evaluating, at each resetting step of the N applied reset operations, the reset technique having the highest relative correction yield among the not yet used available values, the method according to the invention provides a fast and efficient correction sequence for a given array of RM cells. Moreover, the application of different reset techniques makes it possible to deal with the bits of the array having a non-ideal behaviour and to reduce the bit-to-bit variability.

The method according to the invention may also have one or more of the characteristics below, considered individually or according to all the technically possible combinations thereof:
- the reset technique is chosen among a set of techniques comprising: reprogramming, applying voltage pulses with increasing amplitude, applying voltage pulses with increasing temporal duration, applying voltage pulses with the same features;
- the number N of reset operations is comprised between 1 and 9;
- the reset technique to be used at the j-th reset operation is the reset technique having the highest relative programming yield at the j-th reset operation;
- the reset technique to be used at the j-th reset operation is the reset technique having the highest relative correction yield among the values of the relative correction yield that have not yet been used prior to the j-th reset operation;
- the relative correction yield for the array of Resistive Memory cells to be reset is measured prior to the first reset operation;
- the relative correction yield for the array of Resistive Memory cells is measured by performing N reset operation and measuring after each reset operation the resistance of the High-Resistive State of each cell;
- the reprogramming reset technique comprises a step of set the array of Resistive Memory cells followed by a step of reset of the array of Resistive Memory cells;
- when applying voltage pulses with increasing amplitudes, the increase step is comprised between 50 mV and 1 V;
- when applying voltage pulses with increased temporal duration, the temporal width is increased by a decade.
- the reset technique to be used at the j-th reset operation is the reset technique having the highest relative programming yield between:
  - the not yet used values of the relative programming yield for each of the reset techniques that have been already used prior to the j-th reset operation;
  - the values of the relative programming yields of the reset techniques that have not yet been used prior to the j-th reset operation, the values of the relative correction yield of the not yet used reset techniques being taken at the first reset operation.

LIST OF FIGURES

Other characteristics and advantages of the invention will become clear from the description given below for indicative purposes and in no way limiting, with reference to the appended figures, among which:

DETAILED DESCRIPTION OF THE INVENTION

A RM cell is a device comprising two electrodes separated by an insulating layer. It has two stable resistive states HRS and LRS and it is adapted to encode a bit of information in a rewritable, non-volatile memory device.

Prior to the application of the method according to the invention, the cumulative and/or the relative correction yields of the array RM cells must be characterized.

Figure 1:
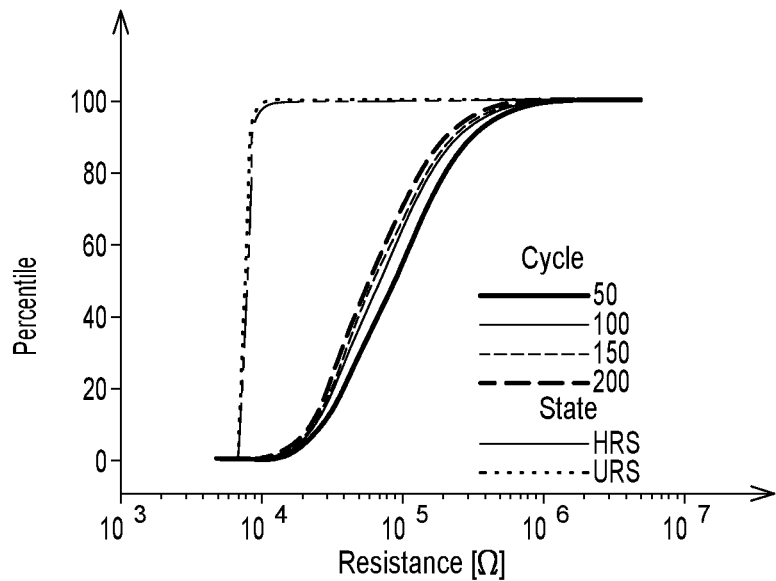
FIG. 1 represents the distribution of the $R_{HRS}$ and $R_{LRS}$ values for an array of RM cells at several reprogramming cycles.
Figure 2:
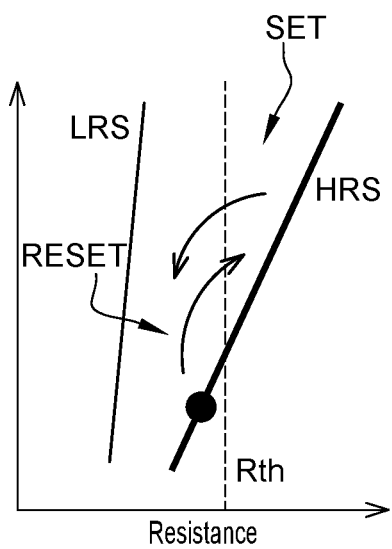
FIG. 2 represents how a RM cell changes its state after a full reprogramming process.
Figure 3A:
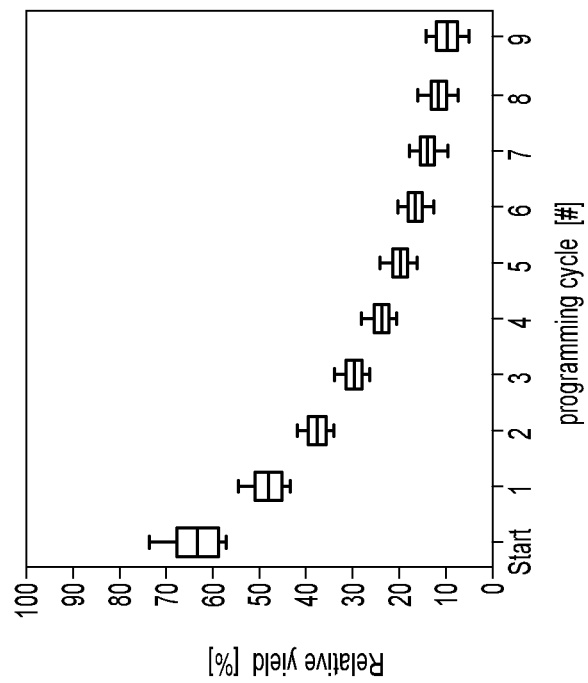
FIG. 3a represents the cumulative programming or correction yield for an array of RM cells as a function of the number of programming cycles.

FIG. 3a shows the cumulative programming yield or cumulative correction yield for an array of RM cells as a function of the number of reset operations or reprogramming cycles. The cumulative correction yield quantifies the percentage of cells over the entire array that were correctly programmed after each reprogramming step.

Figure 3B:
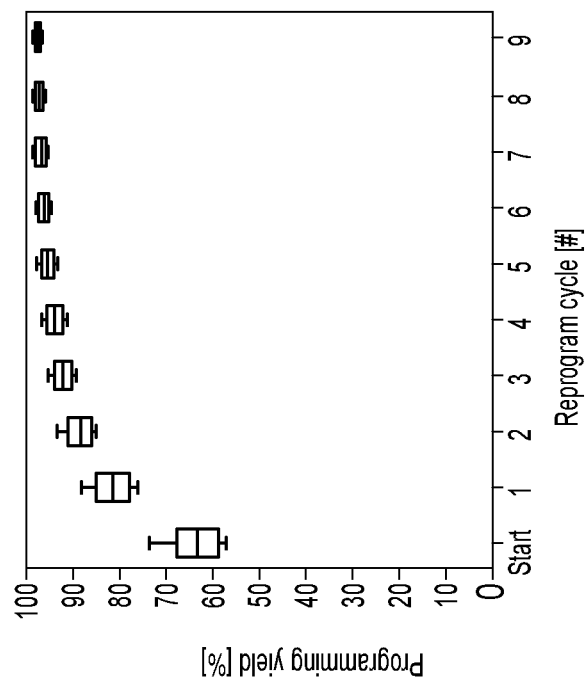
FIG. 3b represents the relative programming or correction yield for an array of RM cells as a function of the number of programming cycles.

FIG. 3b shows the relative programming yield or relative correction yield for an array of RM cells as a function of the number of reset operation or reprogramming cycles. The relative programming yield, on the other hand, represents the percentage of bad cells at the iteration j that were corrected at iteration j+1. In other words, the relative correction yield represents the percentage of cells that were not correctly reset at the reset operation j and that were corrected at iteration j+1.

Figure 4:
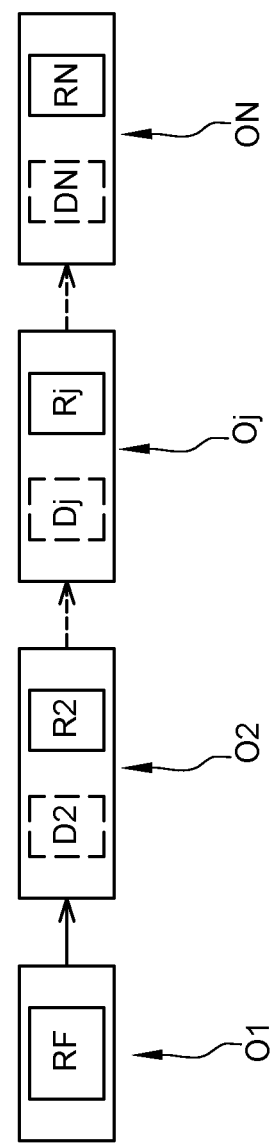
FIG. 4 represent a sketch of the method according to the invention.

FIG. 4 shows a sketch of the method according to the invention.

At the first reset operation O1, the first reset technique to be used is defined DF. This reset technique is used to perform the first reset operation RF.

According to an embodiment, the first reset technique is chosen as the reset technique having the highest relative correction yield at the first reset operation.

At the second j=2 reset operation O2, the reset technique to be used at the j=2 reset operation is defined D2.

These steps Oj are repeated at the j-th reset operation and until the N-th and final reset operation, ON.

The definition Dj of the reset techniques to be used at the j-th reset operation can be done following two different criteria, according two different embodiments of the invention.

Figure 5:
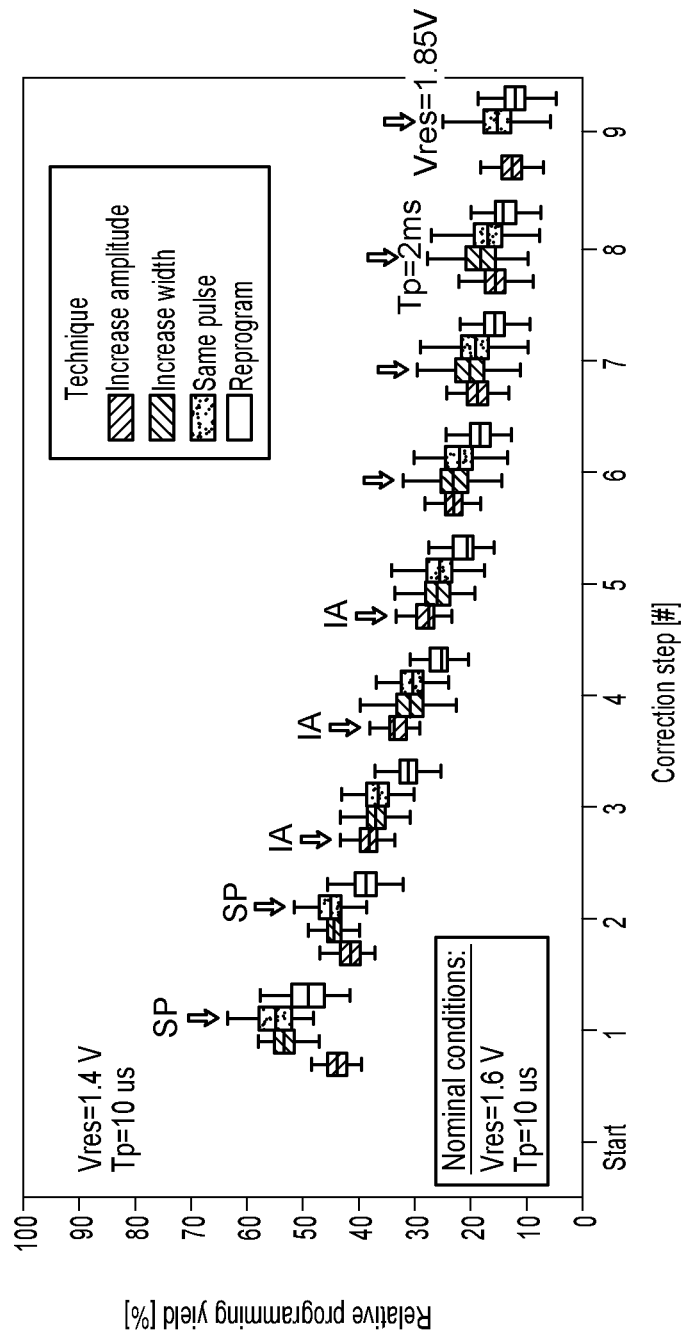
FIG. 5 represents a first embodiment of the invention.

A first embodiment of the invention is represented in FIG. 5, illustrating the first criterium for defining Dj the reset technique to be used at the j-th reset operation. This figure shows the relative correction yield of the different reset techniques at each correction steps. According to this embodiment, the reset technique to be used at the j-th reset operation is the reset technique having the highest relative correction yield at the j-th reset operation. The vertical arrows of FIG. 5 show, at each reset operation, the reset technique having the highest relative correction yield. The initial conditions for the applied voltage pulse and the width of the pulse are respectively $V_{Res}$=1.6 V and $T_p$=10 μs. The same parameters after 9 reset operations are $V_{Res}$=1.85 V and $T_p$=2 ms.

The sequence according to this embodiment will be SP, SP, IA, IA, IA for the first five reset operations.

A second embodiment of the invention is represented in FIGS. 6a-d, illustrating a second criterium for defining Dj the reset technique to be used at the j-th reset operation. Again, these figures show the relative correction yield of the different reset techniques at each correction step. According to this embodiment, the technique to be used at the j-th reset operation is the reset technique having the highest relative correction yield among the values of the relative correction yield that have not yet been used prior to the j-th reset operation.

In other words, according to this embodiment, the reset technique to be used at the j-th reset operation is the reset technique having the highest correction yield among:

The values of the relative correction yield of each of the reset techniques that have been used prior to the j-th reset operation, excluding the values of the relative correction yield that have already been used;

The values of the relative correction yield of the reset techniques that have not yet been used prior to the j-th reset operation.

The application of this criterium is explained in FIGS. 6a, 6b, 6c and 6d.

Figure 6B:
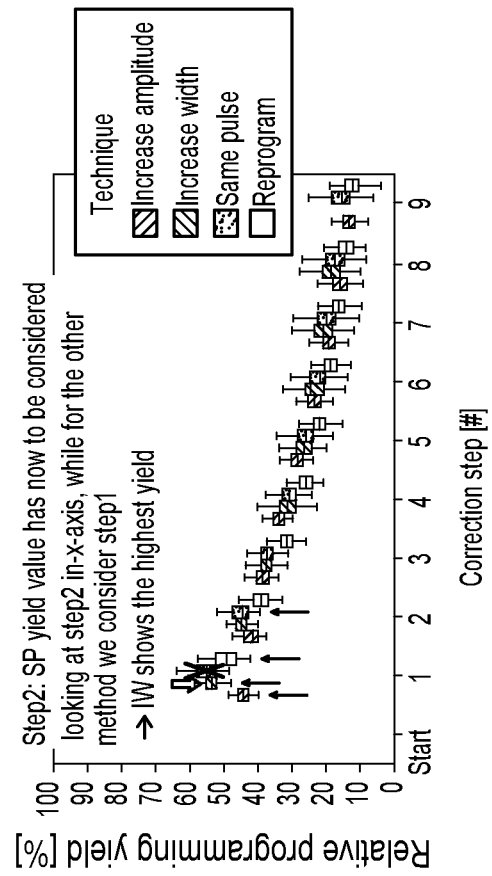
FIGS. 6a, 6b, 6c and 6d represent a second embodiment of the invention.
Figure 6D:
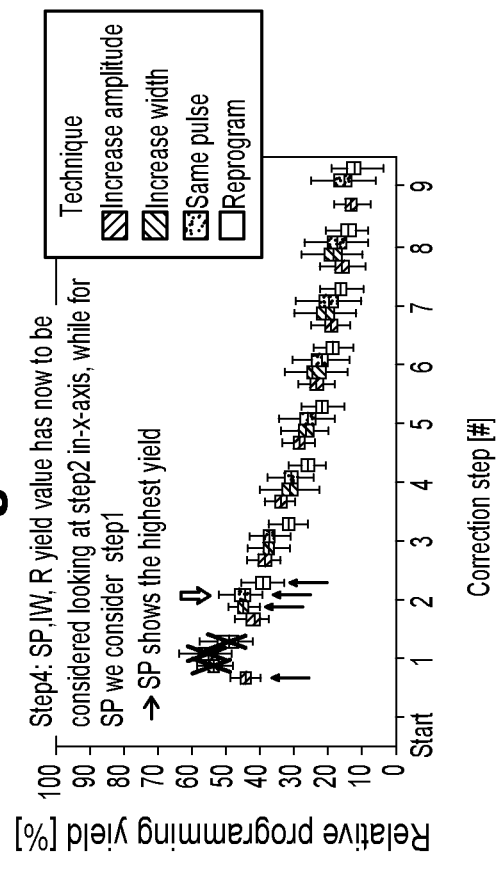
Figure 6A:
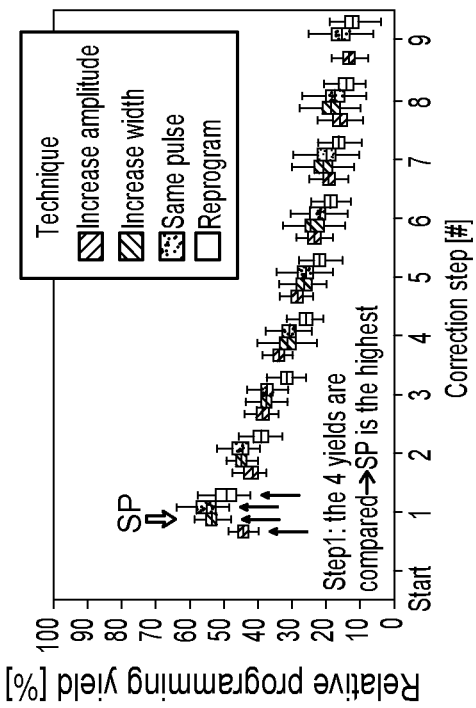

FIG. 6a shows that at the first reset operation, j=1, the values of the reset techniques at this reset operation must be compared, as pointed out by the four arrows below the points. Among these values, the highest one is selected, that is applying the same pulse SP technique. This value is indicated by a vertical arrow above the corresponding point.

FIG. 6b shows how to define the reset technique to be used at the j=2 reset operation. Again, the arrows below the points indicate the relative correction yield values to be compared. In this case, the already used value, i.e. the SP value at step 1 is excluded, as indicated by the cross marked on this value. The highest remaining value is then the Increase Pulse width IW at step 1, as indicated by a vertical arrow above this point.

Figure 6C:
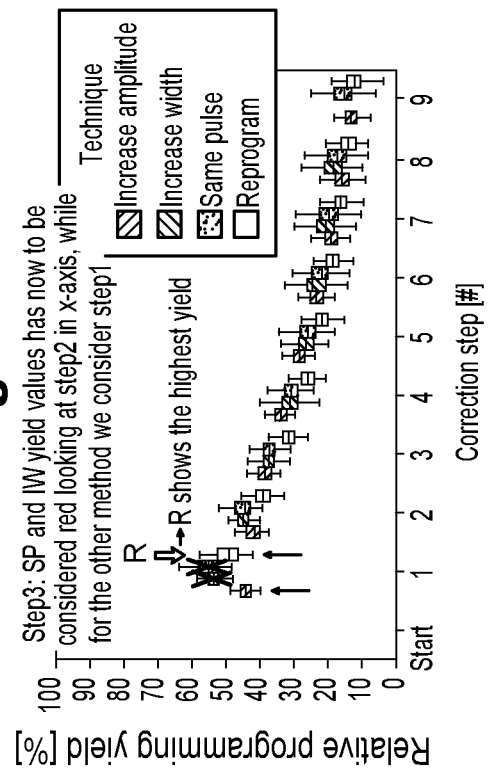

FIG. 6c shows how to define the reset technique to be used at the j=3 reset operation. In this case, the values to be compared, indicated by vertical arrows below the points are IW and SP at step 2 and R and IA at step 1. As in the previous step, the already used values have been excluded, i.e. SP and IW at step 1. The highest of the remaining values is then R taken at step 1.

FIG. 6d shows how to define the reset technique to be used at the j=4 reset operation. In this case the values to be compared, indicated by vertical arrows below the points are IA at step 1 and R, IW and SP at step 2. The excluded values, marked by a cross, are the already used values IW, SP and R taken at step 1. In this case the highest of the not yet used values is SP taken at step 2.

The sequence according to this embodiment will be SP, IW, R, SP, IW for the first four reset operations The figures of merit of FIGS. 3a and 3b have to be independently calculated for each correction technique to quantify their efficiency for each of the N reset operations.

In order to calculate these curves for a given RM technology used by a user, the following procedure can be followed:

For each programming technique, an array of resistive memory devices is chosen.

Typical density is about 1 kb in order to have a large enough statistic.
  a. Memory devices are formed by applying a forming step, i.e.: a positive voltage pulse with sufficient duration. Forming conditions depend on the RM technology and they typically are a voltage pulse with amplitude comprised between 1V and 4V and applied for a time duration comprised between 100 ns and 10 µs.
  b. Some preliminary cycling can be applied to the cell if required by the user: about 10 cycles of SET RESET will be realized, with the typical SET RESET conditions required for the chosen RM technology
  c. Then the reset technique will be evaluated. To this aim, the memories undergo a SET operation, and then a RESET sequence corresponding to the reset technique that has to be evaluated. In particular:

Reprogram: successive SET+RESET sequences are repeated, with standard SET and RESET conditions.

Increased voltage: successive RESET operation with increased voltage are applied. Typically, the amplitude of the voltage pulse applied for the reset $V_{RESET}$ starts at the nominal value, and then is increased by a step that is comprised between 50 mV and 1V.

Increased time: successive RESET operation with increased pulse temporal width are applied. Typically, the pulse temporal width $t_{RESET}$ starts at the nominal value, and then is increased by a log step. As an example, between reset operation j+1 and reset operation j, the incremental time step $t_{j+1}$ can be calculated by $t_{j+1}/t_j=10^x$, x being for example 0.5 or 1. If case x=1, time is increased by one decade at each iteration.

Repeated pulse: successive RESET operation with standard nominal conditions (time and voltage) are repeated.

In general, a maximum number of reset operation or corrections must be allowed: in FIG. 3, for example, we are allowing at most 9 corrections. This means that, at each cycle, the test routine will try to correct a wrong HRS up to 9 times with the technique that we are using (reprogramming, increasing $V_{reset}$ or increasing $T_{reset}$).

2. After the experiment, the readings of the HRS values are considered:

After each programming condition, for each iteration step, cell resistance is measured (reading operation) and compared to a targeted $R_{HRS}$. If $R>R_{HRS}$, the cell is considered RESET. If $R<R_{HRS}$, the RESET operation is considered as failed. It is thus possible to extract the yield for each iteration. Targeted $R_{HRS}$ can be for example $R_{LRS}$ multiplied by the window margin of the memory. Margin can be a factor 2 to 10 for example and is chosen by the user. $R_{LRS}$ depends on the programming current and technology. Typically, for $I_{prog}=100$ µA, $R_{LRS}$ is of the order of 10 kOhms. In this case, assuming margin=2 and $I_{prog}=100$ µA, this leads to targeted $R_{HRS}=20$ kOhms.

Then the user measures the percentage of cells that fail or pass after each iteration step, allowing to construct cumulative and relative correction yields for the tested reset techniques.

The cumulative correction yield is built by considering all the correction iterations one by one, and counting, at each cycle, how many cells have been corrected up to that particular iteration with respect to the total cells in the array. The boxes represent the statistics of the Cumulative Correction Yield at each iteration.

The relative correction yield is built by considering all the correction iterations one by one, and counting, at each cycle, how many cells have been corrected at that particular iteration with respect to the cells that were still bad at the previous iteration. The boxes represent the statistics of the cumulative correction yield at each iteration.

The invention claimed is:

1. A method for resetting an array of Resistive Memory cells, that is for putting at least one cell of the array of Resistive Memory cells in its high resistive state, by applying a sequence of N reset operations, each reset operation comprising application of a reset technique, said method comprising:
   at a first reset operation, performing the first reset operation by applying the reset technique having the highest relative correction yield;
   at a j-th reset operation of the N−1 subsequent reset operations, j being an integer number comprised between 2 and N, defining a reset technique to be used at the j-th reset operation and performing the j-th reset operation;
   the relative programming yield for the array of Resistive Memory cells to be reset being measured prior to the first reset operation by performing N reset operation and measuring after each reset operation the resistance of the High-Resistive State of each cell.

2. The method according to claim 1, wherein the reset technique is chosen among a set of techniques comprising: reprogramming, applying voltage pulses with increasing amplitudes, applying voltage pulses with increasing temporal duration, applying voltage pulses with the same features.

3. The method according to claim 1, wherein the number N of reset operations is comprised between 1 and 9.

4. The method according to claim 1, wherein the reset technique to be used at the j-th reset operation is the reset technique having the highest relative correction yield at the j-th reset operation.

5. The method according to claim 1, wherein the reset technique to be used at the j-th reset operation is the reset technique having a highest relative correction yield among the values of the relative correction yield that have not yet been used prior to the j-th reset operation.

6. The method according to claim 2, wherein the reprogramming reset technique comprises a step of set the array of Resistive Memory cells followed by a step of reset of the array of Resistive Memory cells.

7. The method according to claim 2, wherein when applying voltage pulses with increasing amplitudes, the increase step is comprised between 50 mV and 1 V.

8. The method according to claim 2, wherein when applying voltage pulses with increased temporal duration, a temporal width is increased by a decade.

* * * * *